United States Patent
Higuchi

(10) Patent No.: US 8,860,204 B2
(45) Date of Patent: Oct. 14, 2014

(54) SEMICONDUCTOR DEVICE AND PACKAGE WITH BIT CELLS AND POWER SUPPLY ELECTRODES

(75) Inventor: Koji Higuchi, Ibaraki (JP)

(73) Assignee: OKI Semiconductor Co., Ltd., Yokohama (JP)

( * ) Notice: Subject to any disclaimer, the term of this patent is extended or adjusted under 35 U.S.C. 154(b) by 484 days.

(21) Appl. No.: 12/621,111

(22) Filed: Nov. 18, 2009

(65) Prior Publication Data
US 2010/0127378 A1    May 27, 2010

(30) Foreign Application Priority Data
Nov. 21, 2008  (JP) .................... 2008-297813

(51) Int. Cl.
| | | |
|---|---|---|
| H01L 27/118 | (2006.01) | |
| H01L 23/52 | (2006.01) | |
| H01L 23/48 | (2006.01) | |
| H01L 29/40 | (2006.01) | |
| H01L 23/498 | (2006.01) | |
| H01L 23/00 | (2006.01) | |

(52) U.S. Cl.
CPC .... *H01L 23/4985* (2013.01); *H01L 2924/01033* (2013.01); *H01L 2924/01005* (2013.01); *H01L 2924/01082* (2013.01); *H01L 24/80* (2013.01); *H01L 23/49838* (2013.01); *H01L 24/16* (2013.01); *H01L 2924/01006* (2013.01); *H01L 2924/14* (2013.01); *H01L 2924/01079* (2013.01)
USPC ........... 257/691; 257/202; 257/207; 257/208; 257/776; 257/E23.079

(58) Field of Classification Search
CPC ............... H01L 27/10891; H01L 27/0207; H01L 27/11807; H01L 27/00; H01L 27/2481; H01L 29/00; H01L 29/06; H01L 29/0696; H01L 29/08; H01L 29/0869; H01L 45/00; H01L 45/085; H01L 45/1253; H01L 2027/00; H01L 2027/1187; H01L 2027/11874; H01L 2924/01006; H01L 2924/01082; H01L 2924/01079; H01L 2924/01005; H01L 2924/14; H01L 2924/01033; H01L 23/49838; H01L 23/4985; H01L 24/80; H01L 24/16
USPC .......... 257/208, 691, E23.079, 202, 207, 210, 257/776
See application file for complete search history.

(56) References Cited

U.S. PATENT DOCUMENTS 4,015,247 A * 3/1977 Baker ........................... 365/174
4,715,015 A * 12/1987 Mimoto et al. ............... 365/190

(Continued)

FOREIGN PATENT DOCUMENTS

| JP | H01251640 A | 10/1989 |
|---|---|---|
| JP | 2002341785 A | 11/2002 |

(Continued)

*Primary Examiner* — Teresa M Arroyo
(74) *Attorney, Agent, or Firm* — Taft Stettinius & Hollister LLP; Anthony P. Filomena

(57) ABSTRACT

There is provided a semiconductor device including: plural bit cells each including the same circuit; plural electrodes supplied with power from outside, wherein each of the respective plural electrodes is mounted above the same circuit within the plural bit cells. Further, there is provided a semiconductor package including: the semiconductor device; a substrate mounted with the semiconductor device; an external input terminal formed on the substrate; an external output terminal formed on the substrate; an input wiring pattern connecting the semiconductor device mounted above the substrate and the external input terminal; an output wiring pattern connecting the semiconductor device mounted above the substrate and the external output terminal; and plural power supply lines, arranged without contact with each other on the same face of the substrate, and connecting the plural electrodes mounted to the semiconductor device to the corresponding electrode from the plural external power input electrodes.

12 Claims, 10 Drawing Sheets

(56) References Cited

U.S. PATENT DOCUMENTS

| | | | |
|---|---|---|---|
| 5,150,016 A * | 9/1992 | Sawase et al. | 315/294 |
| 5,448,088 A * | 9/1995 | Nagai et al. | 257/208 |
| 5,585,666 A * | 12/1996 | Imamura | 257/668 |
| 5,952,684 A * | 9/1999 | Tashiro | 257/207 |
| 6,031,982 A * | 2/2000 | Truong et al. | 257/208 |
| 6,335,640 B1 * | 1/2002 | Okamoto | 326/101 |
| 6,469,540 B2 * | 10/2002 | Nakaya | 326/41 |
| 6,492,930 B2 * | 12/2002 | Enriquez | 341/155 |
| 6,768,144 B2 * | 7/2004 | Houston et al. | 257/207 |
| 6,791,128 B1 * | 9/2004 | Yamauchi | 257/206 |
| 6,812,574 B2 * | 11/2004 | Tomita et al. | 257/773 |
| 6,864,518 B1 * | 3/2005 | Longway et al. | 257/202 |
| 7,042,030 B2 * | 5/2006 | Balasuramanian et al. | 257/211 |
| 7,157,937 B2 * | 1/2007 | Apostol et al. | 326/41 |
| 7,230,593 B2 * | 6/2007 | Nakanishi | 345/80 |
| 7,327,594 B2 * | 2/2008 | Jacquet | 365/94 |
| 7,911,069 B2 * | 3/2011 | Fuse | 257/786 |
| 8,345,469 B2 * | 1/2013 | Pelley et al. | 365/154 |
| 8,411,513 B2 * | 4/2013 | Carman | 365/189.02 |
| 2001/0050381 A1 * | 12/2001 | Kimoto | 257/211 |
| 2002/0118269 A1 * | 8/2002 | Sato | 347/237 |
| 2002/0140001 A1 * | 10/2002 | Komaki | 257/207 |
| 2003/0030074 A1 * | 2/2003 | Walker et al. | 257/204 |
| 2003/0122160 A1 * | 7/2003 | Houston et al. | 257/207 |
| 2005/0249003 A1 * | 11/2005 | Kim et al. | 365/205 |
| 2005/0270817 A1 * | 12/2005 | Takeuchi et al. | 365/11 |
| 2007/0030744 A1 * | 2/2007 | Nakamura et al. | 365/203 |
| 2007/0041258 A1 * | 2/2007 | Kim et al. | 365/207 |
| 2007/0228582 A1 * | 10/2007 | Kim | 257/778 |
| 2008/0170430 A1 * | 7/2008 | Miller et al. | 365/156 |
| 2008/0239791 A1 * | 10/2008 | Tran | 365/151 |
| 2009/0059644 A1 * | 3/2009 | Kajigaya | 365/72 |
| 2010/0187634 A1 * | 7/2010 | Becker | 257/369 |
| 2013/0148407 A1 * | 6/2013 | Tsuji et al. | 365/148 |
| 2014/0063964 A1 * | 3/2014 | Futatsuyama | 365/185.17 |

FOREIGN PATENT DOCUMENTS

| | | |
|---|---|---|
| JP | 2006-080167 | 3/2006 |
| JP | 2008-297813 | 8/2013 |

* cited by examiner

SEMICONDUCTOR DEVICE AND PACKAGE WITH BIT CELLS AND POWER SUPPLY ELECTRODES

CROSS-REFERENCE TO RELATED APPLICATIONS

This application is based on and claims priority under 35 U.S.C. §119 from Japanese Patent Application No. 2008-297813 filed on Nov. 21, 2008, the disclosure of which is incorporated by reference herein.

RELATED ART

1. Field of the Disclosure

The present disclosure relates to a semiconductor device equipped with electrodes for supply of power from outside provided at a central portion of the semiconductor device, and a semiconductor package of the same.

2. Description of the Related Art

In a semiconductor package, generally various types of power for driving a semiconductor device mounted above a substrate, are supplied from external input terminals provided on the semiconductor package to electrodes (power source pads) provided on the semiconductor device.

From the standpoint of making power supply more robust, electrodes have recently started to be provided at a central portion of a semiconductor device.

For example, a semiconductor package is described in Japanese Patent Application Laid-Open (JP-A) No. 2006-080167 in which semiconductor device surface bumps provided at a central portion of a semiconductor device are connected to a wiring pattern formed on a substrate, by use of connection lines provided on the substrate and joined to a power source or ground.

However, when, as in the technology described in JP-A No. 2006-080167, the power electrodes are simply provided at a central portion of a semiconductor device, a region for providing the power electrodes needs to be provided at a central portion of a separate semiconductor device. However, the central portion of a semiconductor device is generally a region mounted with bit cells, and, since various elements and wiring is densely packed, major redesign is required in order to provide a new region for power electrodes.

However, if power electrodes are provided above an element mounted in the central portion of the semiconductor device, in order to consider the affect on elements below the power electrodes, reliability tests to match the particular element structure, such as checking multiple design rules and the like, are required, resulting in the need for many processes.

INTRODUCTION TO THE INVENTION

The present disclosure is one that addresses the above issues, and an objective thereof is to provide a semiconductor device provided with power electrodes at a central portion of the semiconductor device, with which reliability tests of the semiconductor device can be easily performed, and a semiconductor package of the same.

In order to achieve the above objective, a first aspect of the present disclosure provides a semiconductor device including:
 a plurality of bit cells each including the same circuit;
 a plurality of electrodes supplied with power from outside,
  wherein each of the respective plurality of electrodes is mounted above the same circuit within the plurality of bit cells.

At each of the plural electrodes supplied with power from outside, since the circuits below the electrodes are the same as each other, reliability tests, such as checking design rules and the like, can be easily performed when considering the effect of the electrodes on the circuits below.

The bit cells may include a driving circuit for driving a display device.

Each of the respective plurality of electrodes may be mounted above a different plural number of the bit cells.

Each of the respective plurality of electrodes is mounted so as to straddle above at least two of the bit cells.

The polarity of the bit cells mounted with the plurality of electrodes may be the same polarity.

The plurality of bit cells may be arranged such that bit cells of positive polarity and bit cells of negative polarity alternate with each other.

The plurality of bit cells may be formed in a specific repeated pattern of bit cells of positive polarity and bit cells of negative polarity, and one of the respective plurality of electrodes is mounted to each of the specific pattern.

The plurality of electrodes may include electrodes that supply different types of power from outside.

The semiconductor device of the first aspect of the present disclosure may further include a plurality of external power input electrodes provided at an outer edge portion of the semiconductor device, wherein the sequence in the direction of the outer edge portion in which the plurality of electrodes supplied with one of different types of power are arranged, is the opposite sequence to that in which the plurality of external power input electrodes are arranged along the outer edge portion.

A second aspect of the present disclosure provides a semiconductor package including:
 the semiconductor device of the first aspect of the present disclosure;
 a substrate mounted with the semiconductor device;
 an external input terminal formed on the substrate;
 an external output terminal formed on the substrate;
 an input wiring pattern connecting the semiconductor device mounted above the substrate and the external input terminal;
 an output wiring pattern connecting the semiconductor device mounted above the substrate and the external output terminal; and
 a plurality of power supply lines, arranged without contact with each other on the same face of the substrate, and connecting the plurality of electrodes mounted to the semiconductor device to the corresponding electrode from the plurality of external power input electrodes.

Here, the substrate may be a film substrate.

According to the aspects of the present disclosure, an effect is obtained in that reliability tests, such as checking design rules and the like, can be easily performed for a semiconductor device provided with power electrodes at a central portion thereof.

BRIEF DESCRIPTION OF THE DRAWINGS

Exemplary embodiments of the present disclosure will be described in detail based on the following figures, wherein.

DETAILED DESCRIPTION

The exemplary embodiments of the present disclosure are described and illustrated below to encompass a semiconductor device equipped with electrodes for supply of power from outside provided at a central portion of the semiconductor device, and a semiconductor package of the same. Of course, it will be apparent to those of ordinary skill in the art that the preferred embodiments discussed below are exemplary in nature and may be reconfigured without departing from the scope and spirit of the present disclosure. However, for clarity and precision, the exemplary embodiments as discussed below may include optional steps, methods, and features that one of ordinary skill should recognize as not being a requisite to fall within the scope of the present disclosure.

First Exemplary Embodiment

Detailed explanation will now be given of an exemplary embodiment of the present exemplary embodiment, with reference to the drawings.

Figure 1:
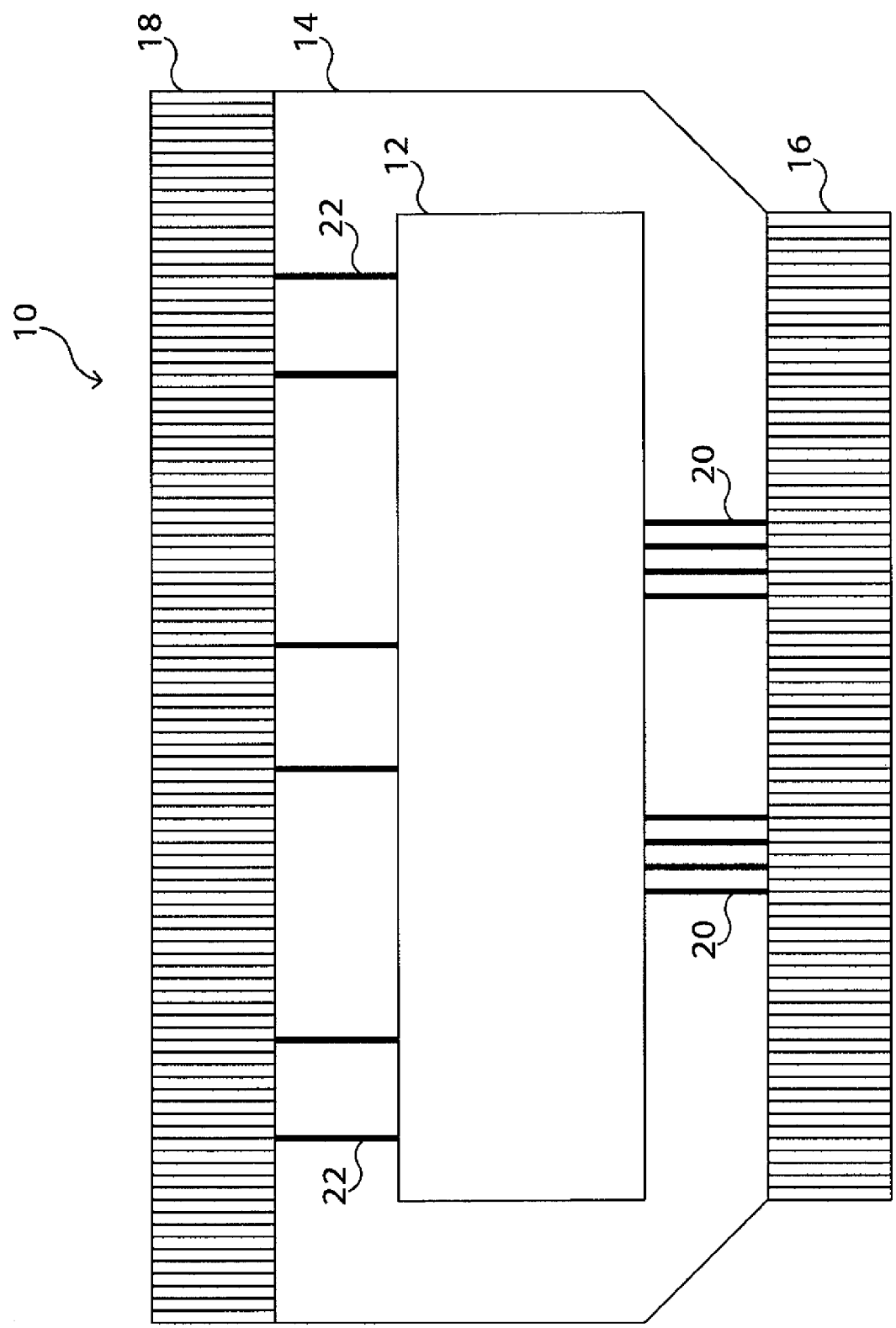
FIG. 1 is a plan view showing an example of a schematic configuration of a semiconductor package according to a first exemplary embodiment of the present disclosure.

Detailed explanation will first be given regarding a semiconductor package of the present exemplary embodiment. FIG. 1 is a plan view showing an example of a schematic configuration of a semiconductor package according to the present exemplary embodiment. Note that the semiconductor package 10 of the present exemplary embodiment is manufactured by a COF (Chip On Film) method, as a driver for a display device.

The semiconductor package 10 includes a semiconductor device 12 (described in detail below) configured as an IC (Integrated Circuit) chip, and an insulating film 14 configured by a film and functioning as a substrate. The semiconductor device 12 is mounted face down on the insulating film 14, such that the face on the side of the semiconductor device 12 formed with the bit cells, wiring and the like (described in detail below), faces towards the insulating film 14.

On the insulating film 14 there is a mounting region, to which the semiconductor device 12 is mounted, and non-mounting region defined at a portion outside the edge of the mounting region. Note that, in the present exemplary embodiment, since the semiconductor device 12 is rectangular shaped, the mounting region is also a region defined in a rectangular shape similar to the semiconductor device 12.

External input terminals 16 and external output terminals 18 are formed on the non-mounting region of the insulating film 14. The external input terminals 16 are input-side outer leads, to which signals for controlling driving of the semiconductor device 12, from a control IC such as a timing controller or the like, and power are input. The external output terminals 18 are output-side outer leads that output signals to outside of the package.

An input wiring pattern 20 for inputting signals, power and the like to the semiconductor device 12 from the external input terminals 16, and an output wiring pattern 22 for outputting output signals and the like to the external output terminals 18 from the semiconductor device 12, are formed on the insulating film 14. The semiconductor device 12 is electrically connected, via metal bumps (electrodes) provided to the semiconductor device 12, to the input wiring pattern 20 and the output wiring pattern 22 by connection nodes (not shown in the drawings) provided on the mounting region of the insulating film 14.

Figure 2:
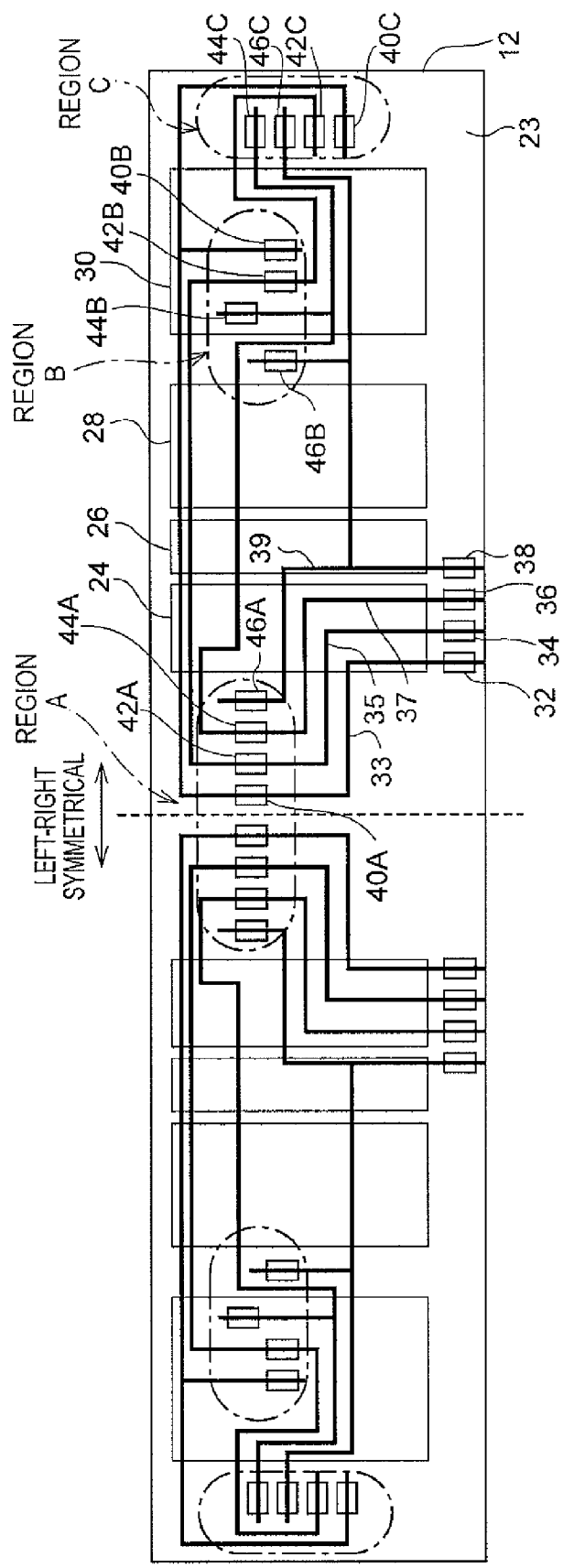
FIG. 2 is plan view showing a specific example of a portion relating to power supply in a configuration of a semiconductor device according to the first exemplary embodiment of the present disclosure.

In addition, power supply lines are formed in the mounting region to the semiconductor device 12, for supplying power to the metal bumps (power electrodes) mounted to the semiconductor device 12 (FIG. 2, explained in detail below).

In the semiconductor package 10 of the present exemplary embodiment, signals input from the external input terminals 16 are input to the semiconductor device 12 by the input wiring pattern 20. The input signals are subjected to specific processing by the semiconductor device 12, an output signal is generated and output. The output signal that has been output is output, using the output wiring pattern 22, externally to the package from the external output terminals 18. Various types of power (described in detail below) that have been input from the external input terminals 16 are input (supplied) to the semiconductor device 12 by the input wiring pattern 20, and the semiconductor device 12 is driven by the various types of power that has been input (supplied).

Explanation will now be given regarding the semiconductor device 12 of the present exemplary embodiment. FIG. 2 is a plan view showing an example of a schematic configuration of a semiconductor device 12 according to the present exemplary embodiment. Note that a portion of the configuration relating to power supply is shown in FIG. 2, and other portions of the configuration are omitted.

The semiconductor device 12 of the present exemplary embodiment is configured so as to have elements and wiring arranged left-right symmetrically about the line A-A' shown in FIG. 2. Explanation will now be given of details of the region corresponding to the right hand side in FIG. 2, by way of example, however the region on the left hand side is a region that is of similar configuration, left-right symmetrical to the right hand side region.

In the semiconductor device 12 of the present exemplary embodiment, a bit cell 24, a ladder circuit 26, a bit cell 28, and a bit cell 30 are formed on a semiconductor device substrate 23. Note that the bit cell 24, the bit cell 28 and the bit cell 30 are multi-channel bit cells (described in detail below).

The semiconductor device 12 in the present exemplary embodiment is also externally supplied (from the external input terminals 16) with various types of power of differing electrical potential from the outside. As a specific example thereof, a case is shown in which four types of power, a VDM 1 (first power supply), a VDM 2 (second power supply), a VDD (third power supply), and a VSS (fourth power supply), are supplied. Note that there is no limitation to these four types of power, and there may be other types of power.

In the semiconductor device 12 of the present exemplary embodiment, there are a first external power input electrode 32, a second external power input electrode 34, a third external power input electrode 36, and a fourth external power input electrode 38, for supplying these four types of power from outside, provided on the semiconductor device substrate 23 at an outer edge portion on the side thereof facing the external input terminals 16. Note that, in order to make power supply robust and the like, there are preferably plural electrodes provided supplied with the same type of power. In the present exemplary embodiment, at each of the locations of the four types of external power input electrodes shown in FIG. 2, there are, by way of example, three electrodes each mounted of the first external power input electrode 32 for supplying the first power supply, the second external power input electrode 34 for supplying the second power supply, the third external power input electrode 36 for supplying the third power supply, and the fourth external power input electrode 38 for supplying the fourth power supply.

Note that in the present exemplary embodiment, all of the external power input electrodes and the internal power electrodes are formed from the same material and are of the same size. As a specific example, these can be formed, for example, from Au bumps on metal pads, however there is not limitation thereto, and bumps of other types of metallic material may be employed. In addition, the external power input electrodes and the internal power electrodes need not all be the same material or the same size.

Figure 3:
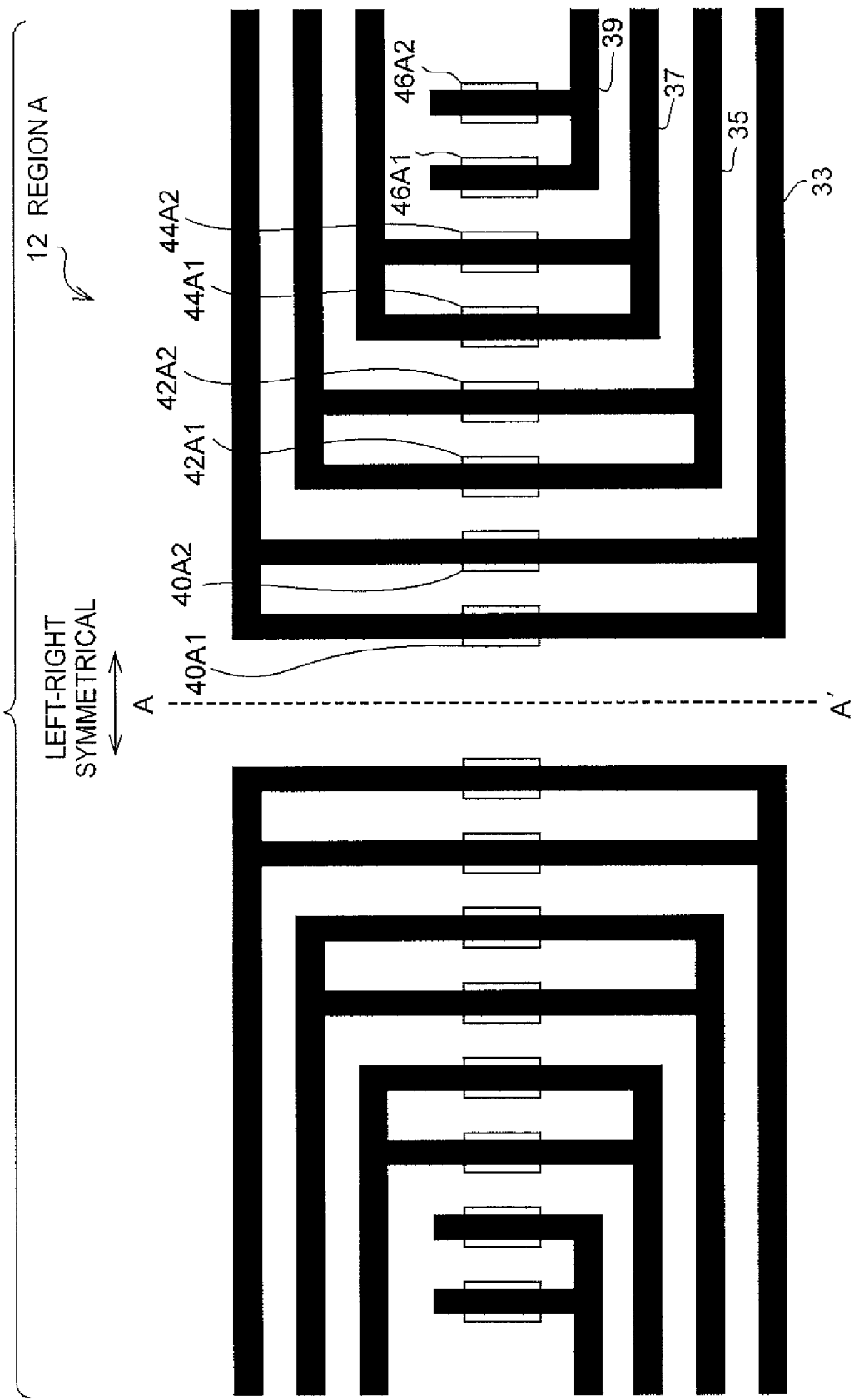
FIG. 3 is a plan view showing a specific example of a layout of various internal power electrodes in a region A of a semiconductor device according to the first exemplary embodiment of the present disclosure.

In addition, a first internal power electrode 40A, a second internal power electrode 42A, a third internal power electrode 44A, and a fourth internal power electrode 46A are provided in the vicinity of the center of the semiconductor device 12 (region A). A specific example of a layout of each of the types of internal power electrode in region A is shown in FIG. 3. There are also, in the same manner as the external power input electrodes, preferably plural electrodes supplied with the same type of power provided for the internal power electrodes.

As shown in FIG. 3, in the present exemplary embodiment, there are two electrodes each mounted on the semiconductor device substrate 23 for the first internal power electrode 40A, the second internal power electrode 42A, the third internal power electrode 44A, and the fourth internal power electrode 46A (first internal power electrodes 40A1, 40A2, second internal power electrodes 42A1, 42A2, third internal power electrodes 44A1, 44A2, fourth internal power electrodes 46A1, 46A2). When explanation is given without discrimination therebetween these will be referred to as the first internal power electrode 40A, the second internal power electrode 42A, the third internal power electrode 44A, and the fourth internal power electrode 46A, respectively, and when discrimination is made then reference will be made with the suffixes 1 and 2 appended thereto.

The first external power input electrode 32 and the first internal power electrode 40A are connected by a first power supply line 33 formed on the insulating film 14. The second external power input electrode 34 and the second internal power electrode 42A are connected by a second power supply line 35. The third external power input electrode 36 and the third internal power electrode 44A are connected by a third power supply line 37. The fourth external power input electrode 38 and the fourth internal power electrode 46A are connected by a fourth power supply line 39.

Figure 4:
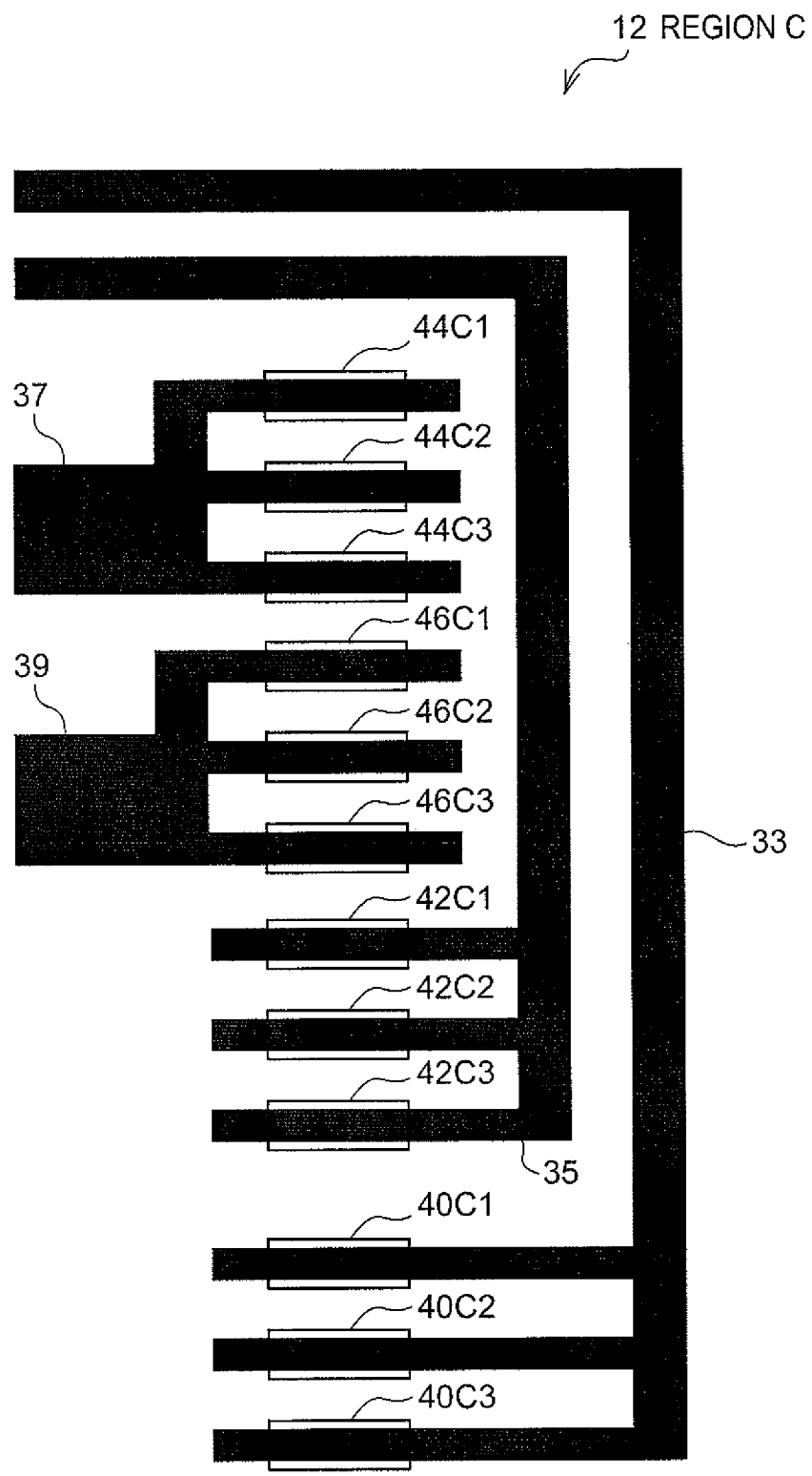
FIG. 4 is a plan view showing a specific example of a layout of various internal power electrodes in a region C of a semiconductor device according to the first exemplary embodiment of the present disclosure.

In addition, at an outer edge portion of the semiconductor device 12 (region C) there are a first internal power electrode 40C, a second internal power electrode 42C, a third internal power electrode 44C, and a fourth internal power electrode 46C provided. FIG. 4 shows a specific example of a layout of each type of internal power electrode in the region C.

As shown in FIG. 4, in the present exemplary embodiment, there are three electrodes each mounted on the semiconductor device substrate 23 for the first internal power electrode 40C, the second internal power electrode 42C, the third internal power electrode 44C, and the fourth internal power electrode 46C (first internal power electrodes 40C1, 40C2, 40C3, second internal power electrodes 42C1, 42C2, 42C3, third internal power electrodes 44C1, 44C2, 44C3, and fourth internal power electrodes 46C1, 46C2, 46C3). When explanation is given without discrimination therebetween these will be referred to as the first internal power electrode 40C, the second internal power electrode 42C, the third internal power electrode 44C, and the fourth internal power electrode 46C, respectively, and when discrimination is made then reference will be made with the suffixes 1, 2 and 3 appended thereto.

Figure 5:
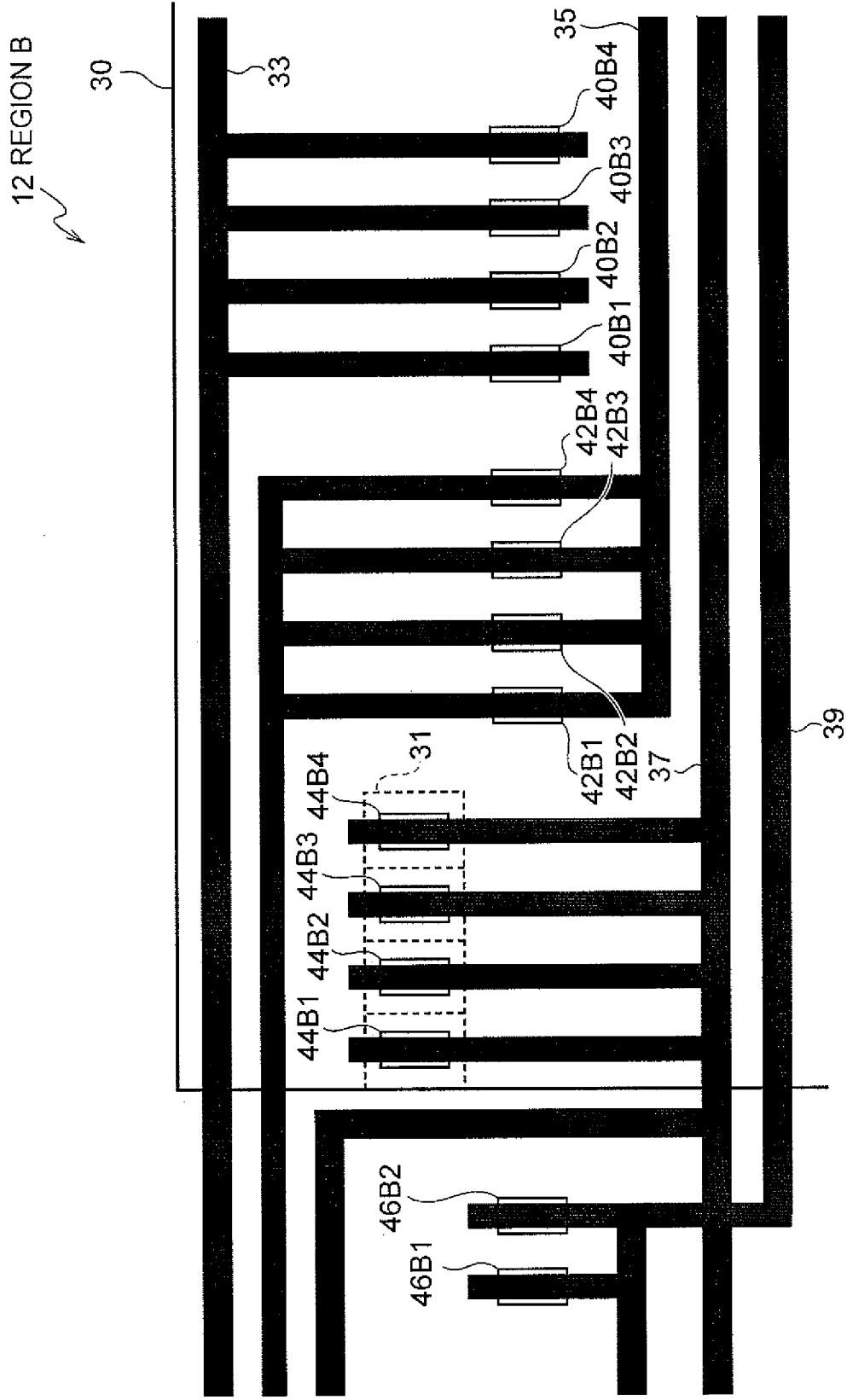
FIG. 5 is a plan view showing a specific example of a layout of various internal power electrodes in a region B of a semiconductor device according to the first exemplary embodiment of the present disclosure.

In addition, there are a first internal power electrode 40B, a second internal power electrode 42B, a third internal power electrode 44B, and a fourth internal power electrode 46B provided at a region of the semiconductor device 12 mounted with the bit cells (region B). FIG. 5 shows a specific example of a layout of each type of internal power electrode in the region B.

As shown in FIG. 5, in the present exemplary embodiment, there are four electrodes each mounted on the semiconductor device substrate 23 for the first internal power electrode 40B, the second internal power electrode 42B, and the third internal power electrode 44B, and two electrodes each for the fourth internal power electrode 46B (first internal power electrodes 40B1, 40B2, 40B3, 40B4, second internal power electrodes 42B1, 42B2, 42B3, 42B4, third internal power electrodes 44B1, 44B2, 44B3, 44B4, fourth internal power electrodes 46B1, 46B2). When explanation is given without discrimination therebetween these will be referred to as the first internal power electrode 40B, the second internal power electrode 42B, the third internal power electrode 44B, and the fourth internal power electrode 46B, respectively, and when discrimination is made then reference will be made with the suffixes 1, 2, 3 and 4 appended thereto.

In the present exemplary embodiment, the first internal power electrode 40B, the second internal power electrode 42B, and the third internal power electrode 44B are mounted above the bit cell 30, and the fourth internal power electrode 46B is mounted on the semiconductor device substrate 23.

Detailed explanation will now be given of mounting of the first internal power electrode 40B, the second internal power electrode 42B, and the third internal power electrode 44B above the bit cell 30.

The bit cell 30 in the present exemplary embodiment is a multi-channel bit cell, and is configured from the same number of the bit cells 31 having the same pattern as the number of channels. In the present exemplary embodiment, as a specific example, the bit cell 30 has bit cells for 300 channels. Namely, the bit cell 30 is configured from 300 individual bit cells 31 (1 channel of output for 1 bit cell).

In the present exemplary embodiment, as shown in FIG. 5, a single internal power electrode is mounted to a single bit cell 31, and internal power electrodes that supply the same type of power are mounted to adjacent bit cells 31 to each other.

Figure 6:
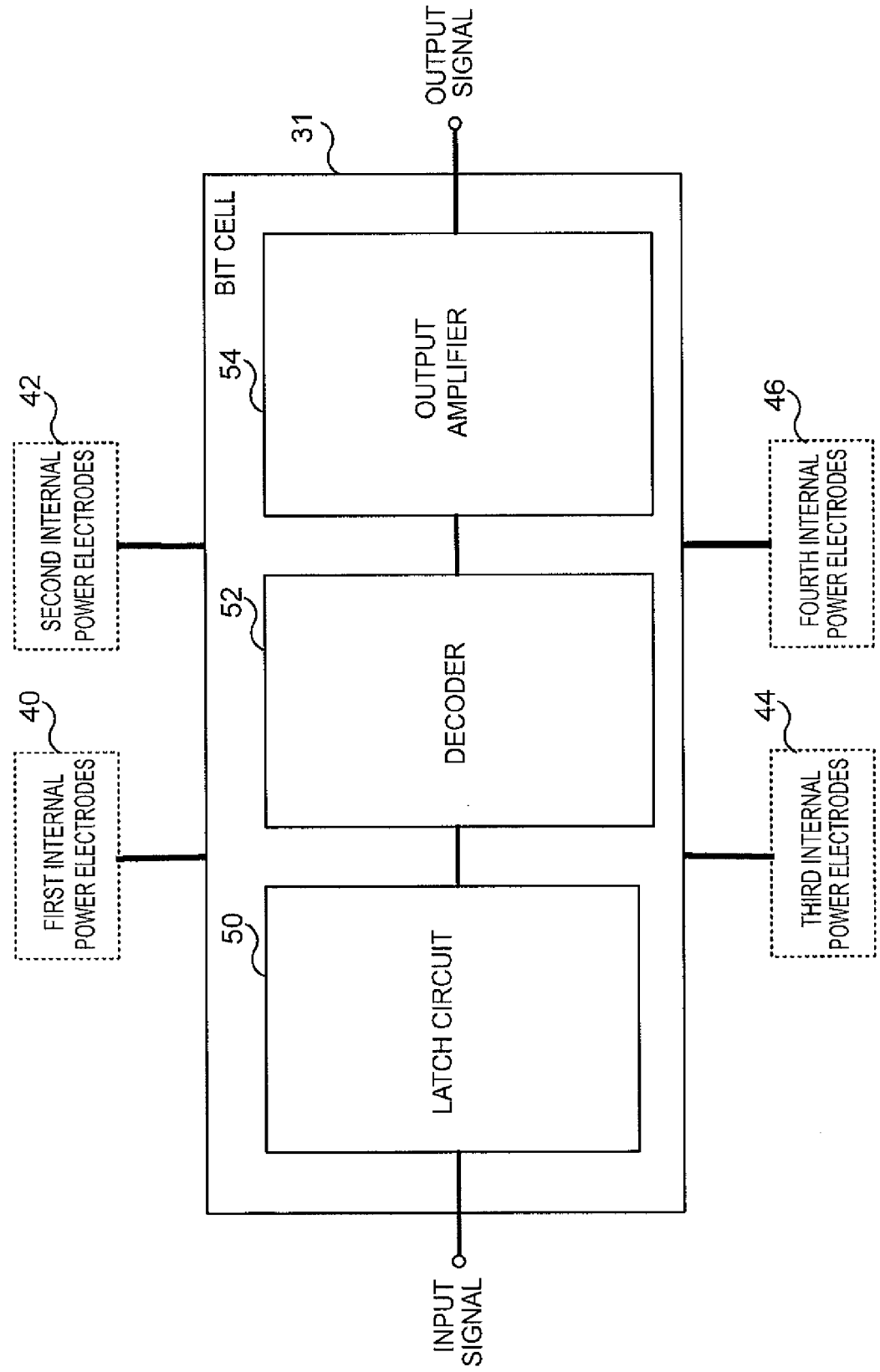
FIG. 6 is a functional block diagram showing an example of a schematic configuration of a bit cell of the first exemplary embodiment of the present disclosure.

The bit cells 31 in the present exemplary embodiment are configured to include plural functions and circuits. FIG. 6 shows a functional block diagram showing an example of a schematic configuration of the bit cell 31 of the present exemplary embodiment. The bit cell 31 of the present exemplary embodiment, as a specific example as shown in FIG. 6, includes a latch circuit 50, a decoder 52, and an output amplifier 54. An input signal that has been input is latched by the latch circuit 50, decoded by the decoder 52, amplified by the output amplifier 54, and output as an output signal. Power for driving the latch circuit 50, the decoder 52, and the output amplifier 54 is supplied from the first internal power electrode 40 (40B), the second internal power electrode 42 (42B), the third internal power electrode 44 (44B), and the fourth internal power electrode 46 (46B).

Figure 7:
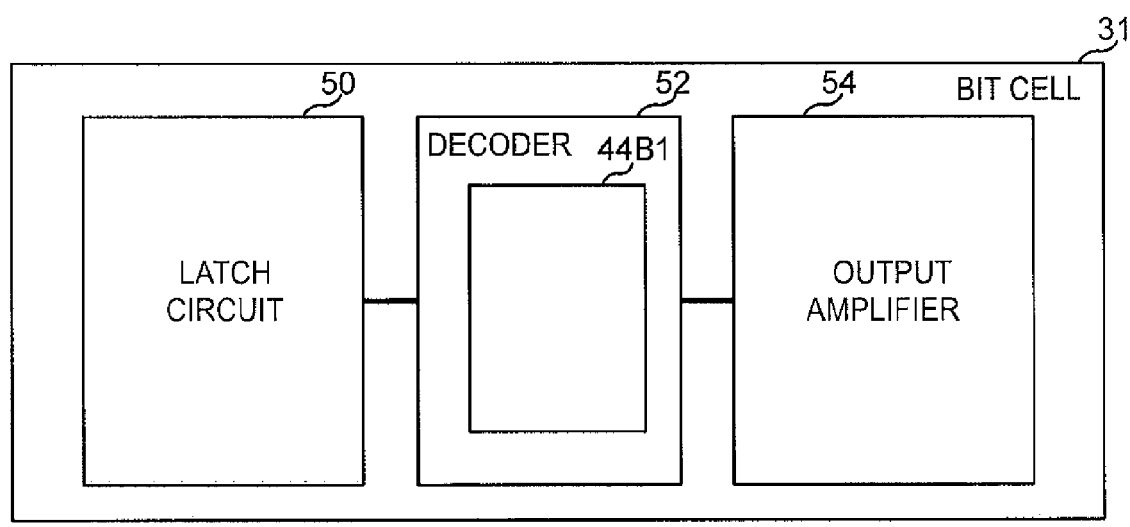
FIG. 7 is a diagram showing a specific example of an internal power electrode of the first exemplary embodiment of the present disclosure mounted above a bit cell.

FIG. 7 shows a specific example of mounting each of the internal power electrodes above the bit cell 31. Note that FIG. 7 shows the representative third internal power electrode 44B1.

In the specific example shown in FIG. 7, the third internal power electrode 44B1 is mounted above the decoder 52. Namely, the decoder 52 of the bit cell 31 is below the third internal power electrode 44B1. The third internal power electrodes 44B2, 44B3, 44B4 are each mounted above a different bit cell 31, in a similar manner to FIG. 7. Namely, there are decoders 52 below all of the third internal power electrodes 44B1, 44B2, 44B3, 44B4, of a similar construction.

The third internal power electrode 44B1 is not limited to being mounted above the decoder 52 in the state shown in FIG. 7, and, for example, may be mounted above the latch circuit 50 and the decoder 52. In such cases, the circuit (element) of the latch circuit 50 and the circuit (element) of the decoder 52 below the third internal power electrode 44B1 may not be the same circuits (elements) as each other, as long as the same circuit (element) of the latch circuit 50 and the same circuit (element) of the decoder 52 are below all of the third internal power electrodes 44B1, 44B2, 44B3, 44B4.

Figure 8:
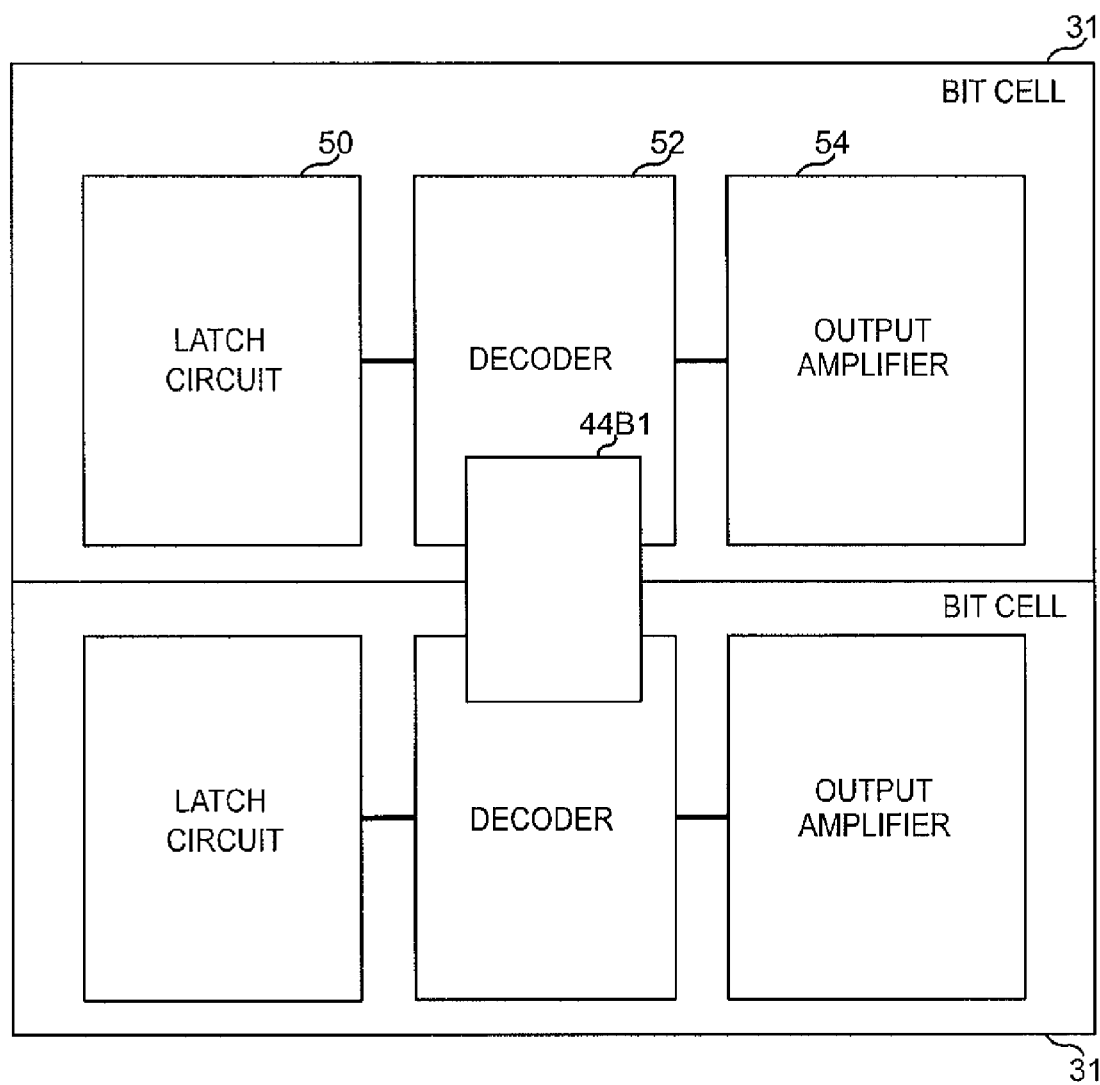
FIG. 8 is a diagram showing a specific example of mounting an internal power electrode of the first exemplary embodiment of the present disclosure straddling plural bit cells.

The third internal power electrode 44B, as shown in FIG. 8, may be mounted so as to straddle plural bit cells 31. In such cases the circuit (element) of the decoder 52 of one of the bit cells 31 below the third internal power electrode 44B1 and circuit (element) of the decoder 52 of the other of the bit cells 31 below the third internal power electrode 44B1 may not be the same circuit (element) as each other, as long as the same circuits (elements) are below all of the third internal power electrodes 44B1, 44B2, 44B3, 44B4.

In the present exemplary embodiment as above, the third internal power electrodes 44B1, 44B2, 44B3, 44B4 are above the same circuit, are preferably above a circuit of the same state and the same structure, and even more preferably mounted above the same element.

In this manner, since the same circuit (element) is below each of the same third internal power electrodes 44B, when considering the effect on this circuit then a single reliability test, such as checking design rules and the like, can suffice. Also, even if the result of the reliability test is that a problem does occur with the design rules or the like, a single type of remedial action investigation can suffice. Consequently, the reliability tests and remediation or the like can be performed in a shorter period of time.

Note that details have been explained with respect to the third internal power electrodes 44B, however, in a similar manner, the same circuits are below all of the first internal power electrodes 40B, and the same circuits are below all of the second internal power electrodes 42B.

In addition, preferably all the internal power electrodes are mounted above the bit cell 31, namely, preferably the same circuit is below the first internal power electrode 40B, the second internal power electrode 42B and the third internal power electrode 44B.

By so doing, since reliability tests can be performed independently of the type of power, the time period for performing reliability tests and remediation can be shortened.

In the present exemplary embodiment, the first internal power electrode 40A, the first internal power electrode 40B and the first internal power electrode 40C are connected by the first power supply line 33 formed on the insulating film 14. The second internal power electrode 42A, the second internal power electrode 42B, and the second internal power electrode 42C are connected by the second power supply line 35. The third internal power electrode 44A, the third internal power electrode 44B and the third internal power electrode 44C are connected by the third power supply line 37. The fourth internal power electrode 46A, the fourth internal power electrode 46B and the fourth internal power electrode 46C are connected by the fourth power supply line 39.

Preferably power supply lines are formed such that power supply lines supplying different power do not make contact (intersect) with each other. In the present exemplary embodiment, the first power supply line 33, the second power supply line 35, the third power supply line 37 and the fourth power supply line 39 are formed on the face of the insulating film 14 at the mounting region for the semiconductor device 12.

Therefore, in the present exemplary embodiment, the placement sequence of the first external power input electrode 32, the second external power input electrode 34, the third external power input electrode 36, and the fourth external power input electrode 38 along the outer edge of the semiconductor device substrate 23 (the sequence in the length direction of the semiconductor device substrate 23) is the opposite sequence to the placement sequence in the outer edge direction of the first internal power electrode 40B, the second internal power electrode 42B, the third internal power electrode 44B and the fourth internal power electrode 46B on the semiconductor device substrate 23.

In the present exemplary embodiment such as this, power supply lines supplying different power can be prevented from making contact with (intersecting) each other by reversing the placement sequence of the four types of external power input electrodes from that of the internal power electrodes.

Note that in the present exemplary embodiment, the internal power electrodes supplying the same type of power are mounted above bit cells 31 that are adjacent to each other, however the there is no limitation thereto, and they may be mounted a specific number of bit cells 31 apart from each other.

The numbers and types of element of bit cells etc. mounted on the semiconductor device substrate 23 shown in the present exemplary embodiment, the numbers of channels of the bit cell 30, the configuration of the bit cells 31, the number of external power input electrodes, and the number of internal power electrodes are also only specific examples thereof, and other embodiments may be made.

There are also no particular limitations to the type of display device to which the semiconductor package 10 is applied, and the semiconductor package 10 can be employed with various types of display device as the display device, such as a liquid crystal display device, a plasma display device, an organic EL display device or the like. There is also no limitation to a semiconductor package provided with a driving circuit for driving a display device, and semiconductor devices and semiconductor packages provided with bit cells equipped with other functionality may be used.

The semiconductor package 10 of the present exemplary embodiment is also not limited to one manufactured by a COF method, and the semiconductor package 10 may be manufactured by another manufacturing method. Furthermore, the semiconductor package 10 of the present exemplary embodiment is not limited to employing the insulating film 14 as a substrate, and another substrate may be used. Note that efficient setting can be performed by employing the insulating film 14 as a substrate.

In the present exemplary embodiment, as explained above, the respective first internal power electrodes 40B1, 40B2, 40B3, 40B4, the respective second internal power electrodes 42131, 42B2, 42B3, 42B4, and the respective third internal power electrodes 44B1, 44B2, 44B3, 44B4 are mounted above circuits (elements) of the bit cells 31 having the same function and same structure. In addition, all of the internal power electrodes mounted above these bit cells 31 are mounted above circuits (elements) having the same function and same structure.

Thereby, since there is the same circuit (element) below each of the internal power electrodes, a single reliability test can suffice. Also, even if the result of the reliability test is that a problem or the like does occur, a single type of remedial action investigation can suffice. Consequently, the reliability tests and remediation or the like can be performed in a shorter period of time.

Second Exemplary Embodiment

In the present exemplary embodiment, detailed explanation will now be given regarding a semiconductor device in which internal power electrodes are mounted above bit cells of the same type, from bit cells having different polarities (positive, negative). Note that those parts of the present exemplary embodiment configuration substantially the same as those of the first exemplary embodiment are allocated the same reference numerals thereto, and detailed explanation thereof will be omitted.

A semiconductor device (IC) generally handles voltages of a positive (H level) and a negative (L level) with respect to a reference voltage. Therefore, elements (bit cells) configuring decoders, output amplifiers, and the like, are designed for positive-use or negative-use. However, when both positive-use and negative-use elements are provided for each output, in the state in which one side is not being used there is waste in the side that is not in use. Consequently, there are semiconductor devices that switch alternately between a positive-use and a negative-use decoder and output amplifier with two outputs.

Figure 9:
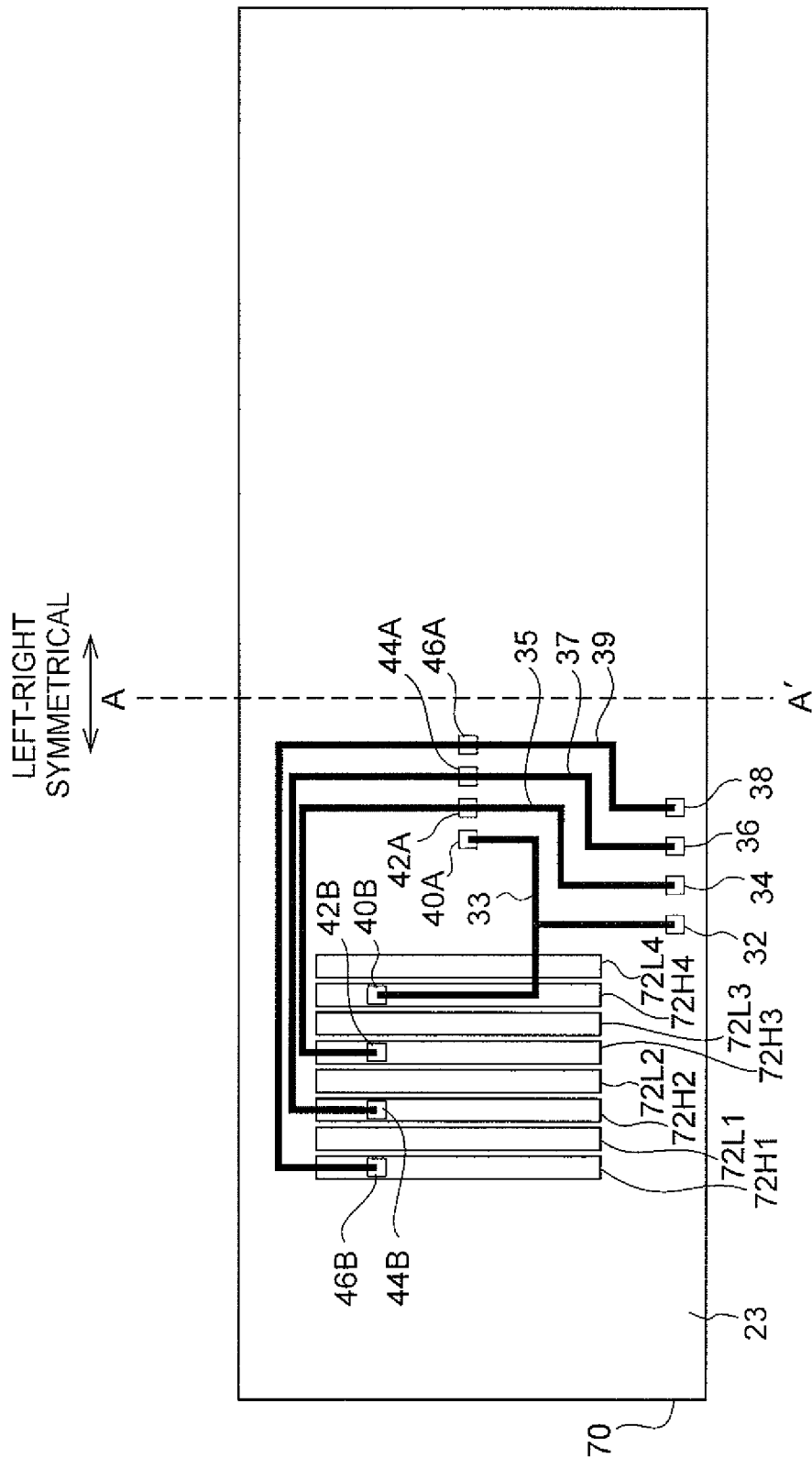
FIG. 9 is a plan view showing a specific example of a portion relating to power supply of a configuration of a semiconductor device mounted with positive-use (H-use) and negative-use (L-use) bit cells according to a second exemplary embodiment of the present disclosure.

FIG. 9 shows a specific example of a portion relating to power supply of a configuration of a semiconductor device formed with positive-use (H-use) and negative-use (L-use) bit cells.

As shown in FIG. 9, a semiconductor device 70 of the present exemplary embodiment has four positive-use bit cells 72H (72H1, 72H2, 72H3, 72H4) formed on a semiconductor device substrate 23. There are also four negative-use bit cells 72L (72L1, 72L2, 72L3, 72L4) formed thereon. The positive-use bit cells 72H and the negative-use bit cells 72L are placed alternately to each other. Note that the positive-use bit cells 72H and the negative-use bit cells 72L differ only in the voltage handled, and they are of the same function and circuit structure (element).

In the present exemplary embodiment, in the same manner as in the first exemplary embodiment, as an example, there is a first external power input electrode 32, a second external power input electrode 34, a third external power input electrode 36, and a fourth external power input electrode 38, each supplied with power of a different voltage value and provided on the semiconductor device substrate 23 along an outer edge portion on the side thereof facing the external input terminals 16.

In addition, in a similar manner to the first exemplary embodiment, a first internal power electrode 40A, a second internal power electrode 42A, a third internal power electrode 44A, and a fourth internal power electrode 46A are provided in the vicinity of the center of the semiconductor device 70. The first external power input electrode 32 and the first internal power electrode 40A are connected by a first power supply line 33. The second external power input electrode 34 and the second internal power electrode 42A are connected by a second power supply line 35. The third external power input electrode 36 and the third internal power electrode 44A are connected by a third power supply line 37. The fourth external power input electrode 38 and the fourth internal power electrode 46A are connected by a fourth power supply line 39.

Furthermore, a first internal power electrode 40B, a second internal power electrode 42B, a third internal power electrode 44B, and a fourth internal power electrode 46B are provided in the region of the semiconductor device 70 to which bit cells are mounted.

In the present exemplary embodiment, the first internal power electrode 40B is mounted above the bit cell 72H4, the second internal power electrode 42B is mounted above the bit cell 72H3, the third internal power electrode 44B is mounted above the bit cell 72H2, and the fourth internal power electrode 46B is mounted above the bit cell 72H1.

In the present exemplary embodiment, in a similar manner to the first exemplary embodiment, the first internal power electrode 40B, the second internal power electrode 42B, the third internal power electrode 44B and the fourth internal power electrode 46B are mounted above the same circuit (element). Furthermore, in the present exemplary embodiment, as shown in FIG. 9, these are mounted above bit cells of the same polarity.

In this manner, since the first internal power electrode 4013, the second internal power electrode 42B, the third internal power electrode 44B and the fourth internal power electrode 4613 are mounted above bit cells of the same polarity, and since the same circuit (element) is below each, when considering the effect on this circuit then a single reliability test, such as checking design rules and the like, can suffice. Also, even if the result of the reliability test is that a problem does occur with the design rules or the like, a single type of remedial action investigation can suffice. Consequently, the reliability tests and remediation or the like can be performed in a shorter period of time.

Figure 10:
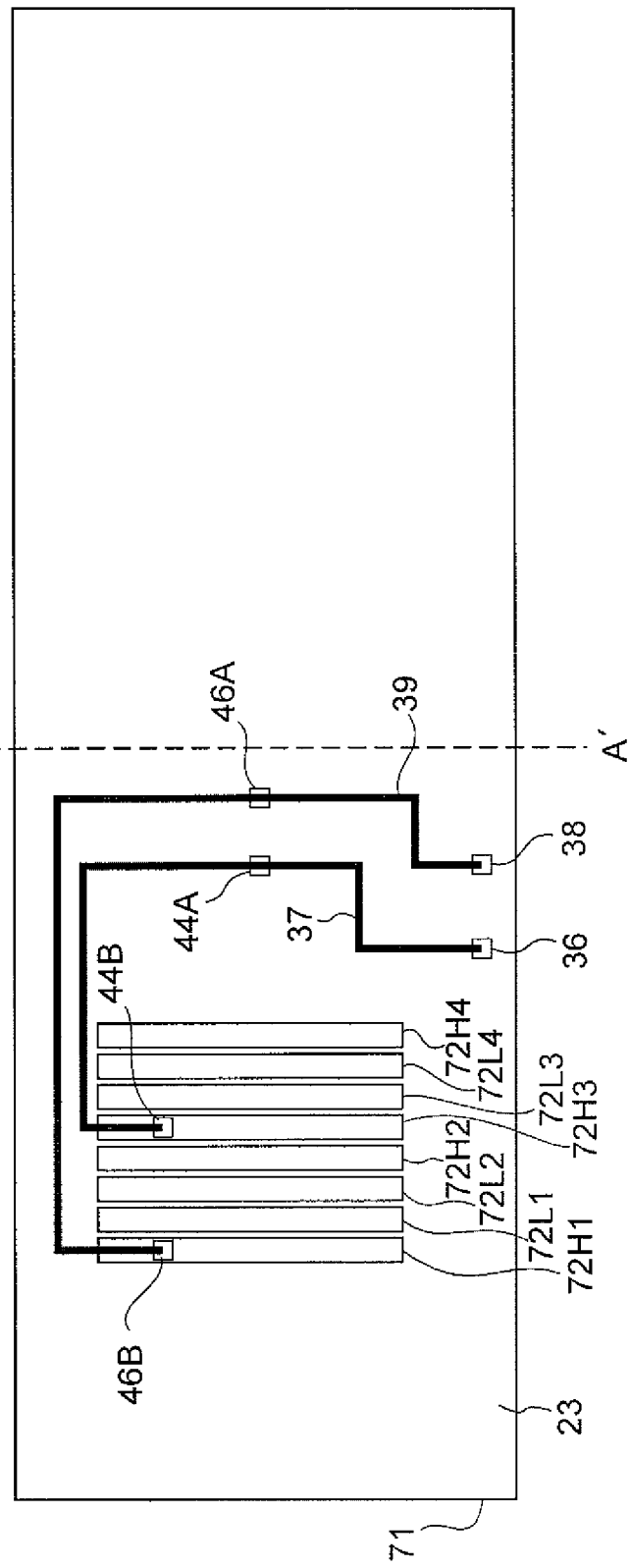
FIG. 10 is a plan view showing another specific example of a portion relating to power supply of a configuration of a semiconductor device mounted with positive-use (H-use) and negative-use (L-use) bit cells according to the second exemplary embodiment of the present disclosure.

Note that while in the present exemplary embodiment the positive-use bit cells 72H and the negative-use bit cells 72L are placed alternately to each other, there is no restriction to this placement of the positive-use bit cells 72H and the negative-use bit cells 72L and another layout (alignment sequence) may be used. A plan view of specific example of another such layout is shown in FIG. 10. In this other example shown in FIG. 10, the positive-use bit cells 72H and the negative-use bit cells 72L are arranged in a repeated sequence of positive-use, negative-use, negative-use, positive-use. Namely, in this other example, the internal power source is mounted above every fourth bit cell. Note that only two types of power supply, the third and the fourth, are shown in FIG. 10, and indications of the first and the second type of power supply have been omitted, however, the first and the second types are disposed in a similar repeated pattern to that of the third and fourth.

Note that, while in the present exemplary embodiment explanation has been given of details of a case in which internal power electrodes are mounted above the positive-use bit cells 72H, a case in which internal power electrodes are mounted above the negative-use bit cells 72L is similar, and a similar effect is obtained by mounting the internal power electrodes only above the bit cells 72L for negative-use.

In the present exemplary embodiment, as explained above, when mounting internal power electrodes above the different polarity positive-use bit cells 7214 and negative-use bit cells 72L of the semiconductor device 70, in addition to the first exemplary embodiment, the internal power electrodes are also only mounted to the same polarity bit cells 72 (only one or other of the bit cells 72H or the bit cells 72L).

By so doing, since the same circuit (element) is below each of the internal power electrodes, a single reliability test can suffice. Also, even if the result of the reliability test is that a problem does occur, a single type of remedial action investigation can suffice. Consequently, the reliability tests and remediation or the like can be performed in a shorter period of time.

Following from the above description and embodiments, it should be apparent to those of ordinary skill in the art that, while the methods and apparatuses herein described constitute exemplary embodiments of the present disclosure, the disclosure is not necessarily limited to the precise embodiments and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the disclosure discussed herein in order to fall within the scope of any claims, since the invention is defined by the claims and since inherent and/or unforeseen advantages of the present disclosure may exist even though they may not have been explicitly discussed herein.

What is claimed is:

1. A semiconductor device comprising:
   a plurality of bit cells each including a same circuit that is duplicated across the plurality of bit cells;
   a plurality of electrodes configured to be supplied with power, wherein each of the respective plurality of electrodes is mounted to overlap the same circuit within a different one of the plurality of bit cells in a top view.

2. A semiconductor device comprising:
   a plurality of bit cells each including a same circuit that is duplicated across the plurality of bit cells;
   a plurality of electrodes configured to be supplied with power, wherein each of the respective plurality of electrodes is mounted to overlap a different set of at least two of the plurality of bit cells and to overlap the same circuit within the set of at least two of the plurality of bit cells in a top view.

3. The semiconductor device of claim 1, wherein a polarity of the bit cells mounted with the plurality of electrodes is the same polarity.

4. The semiconductor device of claim 3, wherein the plurality of bit cells are arranged such that bit cells of positive polarity and bit cells of negative polarity alternate with each other.

5. The semiconductor device of claim 3, wherein the plurality of bit cells arc formed in a repeated unit pattern, the unit pattern including bit cells of positive polarity and bit cells of negative polarity, and each of the respective plurality of electrodes is mounted to each of the plurality of bit cells comprising the same repeated unit pattern.

6. The semiconductor device of claim 1, wherein the plurality of electrodes include electrodes configured to supply different types of power.

7. The semiconductor device of claim 1, further comprising a plurality of external power input electrodes provided at an outer edge portion, wherein the plurality of electrodes are provided in a first arrangement configured to supply different types of power originating from outside and a second arrangement configured to supply different types of power originating from outside, wherein the first arrangement is opposite to the second arrangement.

8. The semiconductor device of claim 2, wherein a polarity of the bit cells mounted with the plurality of electrodes is the same polarity.

9. The semiconductor device of claim 8, wherein the plurality of bit cells are arranged such that bit cells of positive polarity and bit cells of negative polarity alternate with each other.

10. The semiconductor device of claim 8, wherein the plurality of bit cells arc formed in a repeated unit pattern, the unit pattern including bit cells of positive polarity and bit cells of negative polarity, and each of the respective plurality of electrodes is mounted to each of the plurality of bit cells comprising the same repeated unit pattern.

11. The semiconductor device of claim 2, wherein the plurality of electrodes include electrodes configured to supply different types of power.

12. The semiconductor device of claim 2, further comprising a plurality of external power input electrodes provided at an outer edge portion, wherein the plurality of electrodes are provided in a first arrangement configured to supply different types of power originating from outside and a second arrangement configured to supply different types of power originating from outside, wherein the first arrangement is opposite to the second arrangement.

* * * * *